United States Patent [19]

Nagasawa

[11] Patent Number: 4,467,226

[45] Date of Patent: Aug. 21, 1984

[54] DARLINGTON COMPLEMENTARY CIRCUIT FOR PREVENTING ZERO CROSSOVER DISTORTION

[75] Inventor: Shigeru Nagasawa, Kawasaki, Japan

[73] Assignee: Tokyo Shibaura Denki Kabushiki Kaisha, Kawasaki, Japan

[21] Appl. No.: 288,797

[22] Filed: Jul. 31, 1981

[30] Foreign Application Priority Data

Sep. 5, 1980 [JP] Japan ............................. 55-122997

[51] Int. Cl.³ ...................... H03K 3/26; H03K 17/60
[52] U.S. Cl. ..................................... 307/315; 307/255
[58] Field of Search ................... 307/315, 255; 357/46

[56] References Cited

U.S. PATENT DOCUMENTS 3,533,007 10/1970 Segar ................................. 307/315
3,538,353 11/1970 Hanger ............................. 307/255
4,149,098 4/1979 Wright ............................. 307/315

FOREIGN PATENT DOCUMENTS 2934594 3/1980 Fed. Rep. of Germany ...... 307/315

OTHER PUBLICATIONS

Toshiba, IC Technical Handbook for Toshiba Operational Amplifier IC, Second Edition, Apr. 19, 1977, pp. 34 and 35.
Toshiba, IC Technical Handbook for Toshiba Acoustic Linear IC (for Low Frequency) 5th Edition, May, 1980, pp. 66, 69 and 72.

Primary Examiner—Stanley D. Miller
Assistant Examiner—B. P. Davis
Attorney, Agent, or Firm—Finnegan Henderson Farabow Garrett & Dunner

[57] ABSTRACT

A Darlington complementary circuit including first and second signal channel Darlington pairs each of which pair has an input and output transistor, wherein a diode is coupled in series with the base-emitter path of the output transistor of each pair to assure simultaneous turn-off of the transistors of each pair, and thereby prevent distortion of an output signal as one pair ceases operation and the other pair begins operation.

3 Claims, 2 Drawing Figures

DARLINGTON COMPLEMENTARY CIRCUIT FOR PREVENTING ZERO CROSSOVER DISTORTION

BACKGROUND OF THE INVENTION

The present invention relates to Darlington complementary circuits.

Prior art Darlington complementary circuits employ first and second signal channel Darlington pairs, both of which pairs are powered by a single pre-driver transistor. This pre-driver transistor is biased to operate within a linear region of its operating characteristics. However, during zero-crossover of a signal, that is upon switch-over from the first to second Darlington pair or vice versa, the output impedance of the pre-driver transistor, namely the impedance of the Darlington pairs, is altered causing operating of the pre-driver transistor outside the linear region. This non-linear operation during zero-crossover results in an undesirable distortion of the output signal.

SUMMARY OF THE INVENTION

It is an object of the subject invention to provide an improved Darlington complementary circuit which prevents zero-crossover distortion.

To achieve the foregoing objective, and in accordance with the purposes of the invention as embodied and broadly described herein, the Darlington complementary circuit of the present invention comprises a pre-driver transistor providing an output signal; an output terminal; first and second complementary Darlington pairs, said pairs coupled in parallel between the output of said pre-driver transistor and said output terminal, said pairs each comprising an input transistor and output transistor, said pairs being connected to said pre-driver transistor with said first pair being conductive when said output signal from said pre-driver transistor exceeds a turn-on level and said second pair being conductive when said output signal from said pre-driver transistor is less than said turn-on level; and means for maintaining the impedance of said first and second Darlington pairs constant during cross-over of said turn-on level by said output signal. Preferably the means for maintaining includes means for turning off the input transistor of each pair immediately upon turn-off of the output transistor of each pair. The means for turning-off preferably includes two diodes, one coupled in parallel to the base-emitter path of the output transistor of each of the pairs.

In a more narrow sense, the Darlington complementary circuit of the subject invention comprises first and second power source terminals; an input terminal; an output terminal; first and second transistors, each of the first and second transistor having a base, an emitter, and a collector electrode, the first transistor base electrode being connected to the second transistor emitter electrode, and said first transistor collector and emitter electrodes being connected to said first power source terminal and said output terminal, respectively; third and fourth transistors, each of said third and fourth transistors having a base, an emitter, and a collector electrode, said third transistor base electrode being connected to said fourth transistor collector electrode, and said third transistor collector and emitter electrodes being connected to said output terminal and said second power terminal, respectively; a fifth transistor having a base, an emitter, and a collector electrode, said fifth transistor collector electrode being connected to the base electrodes of said second and fourth transistors, and said fifth transistor emitter and base electrodes being connected to said second power source terminal and said input terminal, respectively; a constant current source connected to said fifth transistor collector electrode; means for coupling said fourth transistor emitter electrode to said output terminal; a first resistor and first diode connected in series with each other, with said series connected in parallel and in the same direction of conduction as the base-emitter path of said first transistor; and a second resistor and second diode connected in series with each other, with said series connected in parallel and in the same direction of conduction as the base-emitter path of said third transistor.

BRIEF DESCRIPTION OF THE DRAWINGS

A greater appreciation of the objects and advantages of the invention may be understood by a detailed description taken into conjunction with the drawings, wherein.

Similar elements are identified by the same reference numeral in each of these figures.

DESCRIPTION OF THE PREFERRED EMBODIMENT

Figure 1:
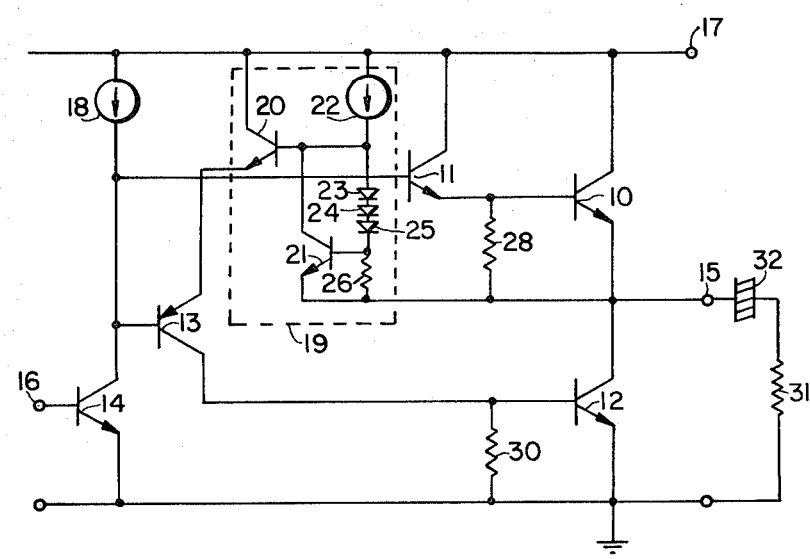
FIG. 1 is a circuit diagram of a modification of a prior art Darlington complementary circuit.

FIG. 1 is a circuit diagram of a modification of a prior art Darlington complementary circuit having an input terminal 16 and an output terminal 15. A pre-driver transistor 14 is shown having a base coupled to input terminal 16, a collector coupled to a DC power terminal 17 through a constant current source 18, and an emitter connected to ground.

A first Darlington pair is shown to include an input transistor 11 and an output transistor 10. A second Darlington pair is shown to include an input transistor 13 and an output transistor 12. The first and second Darlington pairs are connected in parallel between the output of transistor 14, namely the collector electrode of transistor 14, and output terminal 15. More specifically, the base of transistor 11 is connected to the collector of transistor 14, the collector of transistor 11 is connected to power supply terminal 17, and the emitter of transistor 11 is coupled to the base of transistor 10. The collector of transistor 10 is connected to the power supply terminal 17, and the emitter of transistor 10 is connected to the output terminal 15.

The collector of transistor 12 is also coupled to output terminal 15, the emitter of transistor 12 is coupled to ground, the base of transistor 12 is coupled to the collector of transistor 13. The base of transistor 13 is coupled to the collector of transistor 14, whereas the emitter of transistor 13 is coupled to output terminal 15 through a coupling circuit 19. Resistor 28 couples the base of transistor 10 to output terminal 15, and resistor 30 couples the base of transistor 12 to ground.

Coupling circuit 19 includes transistors 20 and 21, a constant current source 22, diodes 23, 24, and 25, and a resistor 26. The emitter of transistor 20 is connected to the emitter of transistor 13, while the collector of transistor 20 is coupled to power supply terminal 17. The base of transistor 20 is connected to output terminal 15 through the collector-emitter path of transistor 21, with the emitter of transistor 21 coupled directly to output terminal 15. Constant current source 22 is also connected to the output terminal 15 through a series combinations of forward-biased diodes 23, 24, and 25 and resistor 26. The base of transistor 21 is coupled to the junction of diode 25 and resistor 26, and the collector of transistor 21 is coupled to the junction of constant current source 22 and diode 23.

The series combination of a load 31 and capacitor 32 is coupled between output terminal 15 and ground.

Pre-driver transistor 14 is biased to normally operate within a linear range of voltage characteristics between the base and emitter electrodes of transistor 14. This biasing is primarily achieved by the impedance of the first and second Darlington pairs consisting of transistors 10 and 11, and 12 and 13, respectively, since constant current source 18 has a very large output of impedance.

In operation, transistors 10 and 11 are biased ON, provided the voltage at the base of transistor 11 is at least above the voltage appearing at output terminal 15 by twice the amount of base-emitter voltage needed to render transistors 10 and 11 ON, namely $2V_{BE}$. When sufficient current flows from constant current source 22 through diodes 23, 24, and 25, and the base-emitter drop of transistor 21, a total voltage drop from the anode of diode 23 to the emitter of transistor 21, $V_F$, is the equivalent of four base-to-emitter voltage drops $4V_{BE}$. Since the base of transistor 11 is coupled to the anode of diode 23 through the base-to-emitter paths of transistors 20 and 13, the base of transistor 11 is maintained at two base-to-emitter voltage drops below $V_F$, provided sufficient current passes through diodes 23, 24, 25 and transistor 21. In this condition, both transistors 11 and 10 are turned on.

However, as an input signal to terminal 16 begins to drive transistor 14, the voltage at the collector of transistor 14 decreases, thereby decreasing the voltage at the base of transistor 13, and causing transistor 13 to begin to conduct. As transistor 13 begins to conduct, current is drawn from transistor 20 which in turn draws current from constant current source 22, which current otherwise would have been available to diodes 23, 24, 25 and transistor 21. As current is drawn by transistors 13 and 20 from diodes 23, 24, 25 and transistor 21, the voltage drop $V_F$ decreases, thereby putting the base of transistor 11 at a potential below two base-to-emitter voltage drops above output terminal 15. Without a sufficient voltage differential between the base of transistor 11 and output terminal 15 to drive both transistors 10 and 11, transistor 10 necessarily shuts off. However, emitter current from transistor 11 is permitted to pass to output terminal 15 through resistor 28, thereby permitting transistor 11 to remain on until pre-driver transistor 14 is sufficiently turned on to force transistor 11 into a non-conducting state.

When transistor 10 is non-conductive and transistor 11 is conductive, the current gain factor from the base electrode of transistor 11 to output terminal 15 is $h_{FE11}$ of the transistor 11. The impedance $Z_1$, from the base electrode of transistor 11 to output terminal 15 can be expressed as follows:

$$Z_1 = (R_L + R_1)h_{FE11}$$

where $R_L$ is the resistance of load 31 and $R_1$ is the resistance of resistor 28.

When both transistors 10 and 11 are conductive, the impedance $Z_2$ from the base electrode of transistor 11 to output terminal 15 can be expressed as follows:

$$Z_2 = R_L \cdot h_{FE10} \cdot h_{FE11}$$

where $h_{FE10}$ is the current gain factor of transistor 10. Since $h_{FE10}$ and $h_{FE11}$ are between 100 and 200, $Z_1$ is much smaller than $Z_2$.

Accordingly, the load impedance of pre-driver transistor 14 is small when transistor 10 is non-conductive and transistor 11 is conductive. The variation of the impedance causes a cross-over distortion in the output signal as the first Darlington pair of transistors 10 and 11 begins to turn off and the second Darlington pair of transistors 12 and 13 begins to turn on, namely during cross-over, since transistor 14 operates at this time in a non-linear region of its characteristics.

A similar cross-over distortion occurs as transistors 12 and 13 begin to turn off, and transistors 10 and 11 begin to turn on.

In accordance with the present invention, there is provided means for maintaining the impedance of the first and second Darlington pairs constant during cross-over of a turn-on level by the output of the pre-driver transistor, above which the first Darlington pair is operative. As contemplated, this means for maintaining includes means for turning off the input transistor of each pair immediately upon turn-off of the output transistor of that pair.

Figure 2:
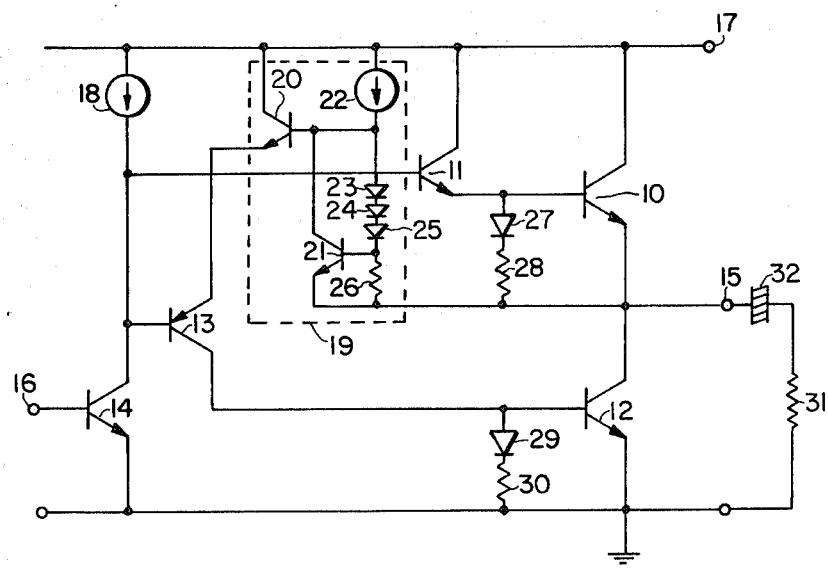
FIG. 2 is a circuit diagram according to the subject invention.

As illustratively shown in FIG. 2, the means for turning off may include two diodes 27, 29 with diode 27 coupled in parallel to the base-emitter path of output transistor 10, and diode 29 coupled in parallel to the base-emitter path of transistor 12. More specifically, diode 27 is shown coupled in series with resistor 28 with the series of diode 27 and resistor 28 connected in parallel with and in the same direction of conduction as the base-emitter path of transistor 10. Diode 29 is connected in series with resistor 30, with the series connected in parallel with and in the same direction of conduction as the base-emitter path of transistor 12.

The base emitter voltage to render transistors 10 and 12 conductive is $V_{BE}$. The forward voltage to render diodes 27 and 29 conductive is $V_D$. Since $V_{BE}$ is nearly equal to $V_D$, the transistor 10 and the diode 27 are able to become conductive at the same time. Similarly, transistor 12 and diode 29 are able to become conductive at the same time. Thus, when transistor 10 becomes non-conductive, a current does not flow through resistor 28 by diode 27. Similarly, a current does not flow through resistor 30 by diode 29 when transistor 12 becomes non-conductive.

When transistor 10 and 12 are operative, the impedance $Z_3$ from the base electrode of transistor 11 to output terminal 15 can be expressed as follows:

$$Z_3 = R_L \cdot h_{FE10} \cdot h_{FE11}$$

When transistors 12 and 13 are operative, impedance $Z_4$ from the base electrode of transistor 13 to output terminal 15 can be expressed as follows:

$$Z_4 = R_L \cdot h_{FE12} \cdot h_{FE13}$$

where $h_{FE12}$ and $h_{FE13}$ are the current gain factors of transistors 12 and 13, respectively. Accordingly, the load impedance of transistor 14 is almost constant since transistors 10 and 11 become non-conductive at the same time, and since the transistors 12 and 13 become non-conductive at the same time. Although the output signal is small, impedance $Z_3$ or $Z_4$ is almost constant. The constant load impedance of transistor 14 prevents cross-over distortion.

After each cross-over point, as the output current increases beyond that point, the IR drop of the resistor 28 also increases. The terminal voltage of diode 27 is smaller than the base-emitter voltage of transistor 10. When the current through diode 27 and the current through resistor 28 decreases, then the emitter current of transistor 10 increases. Accordingly, the non-linearity of the current gain factor of the final output transistor 10 is improved when the emitter current (that is, the output current) of transistor 10 is large.

In the foregoing example, transistors 10, 11, 12 and 14 are of the NPN type and transistor 13 is of the PNP type. However, transistors 10, 11, 12 and 14 can be of PNP type and transistor 13 of NPN type. In this case, the conductivity of diodes 27 and 29 is reversed.

While a particular embodiment of the present invention has been shown and described, it will, of course, be obvious to one skilled in the art that certain advantages and modifications may be effected without departing from the spirit of the invention, and, accordingly, it is intended that the scope of the invention may not be determined by the foregoing examples but only by the scope of the appending claims.

What is claimed is:

1. A Darlington complementary circuit comprising:
   a. a pre-driver transistor providing an output signal;
   b. an output terminal;
   c. first and second complementary Darlington pairs, said pairs coupled in parallel between the output of said pre-driver transistor and said output terminal, said pairs each comprising an input transistor and an output transistor, said pairs being connected to said pre-driver transistor with said first pair being conductive when said output signal from said pre-driver transistor exceeds a turn-on level and said second pair being conductive when said output signal from said pre-driver transistor is less than said turn-on level; and
   d. means for maintaining the impedance of said first and second Darlington pairs constant during cross-over of said turn-on level by said output signal including means for turning off said input transistor of each pair immediately upon turn-off of said output transistor of that pair.

2. The circuit of claim 1 wherein said means for turning-off includes two diodes, one coupled in parallel to the base-emitter path of the output transistor of each of said pairs.

3. A Darlington complementary circuit comprising:
   a. first and second power source terminals;
   b. an input terminal;
   c. an output terminal;
   d. first and second transistors, each of said first and second transistors having a base, an emitter and a collector electrode, the first transistor base electrode being connected to the second transistor emitter electrode and said first transistor collector and emitter electrodes being connected to said first power source terminal and said output terminal, respectively;
   e. third and fourth transistors, each of said third and fourth transistors having a base, an emitter, and a collector electrode, said third transistor base electrode being connected to said fourth transistor collector electrode and said third transistor collector and emitter electrodes being connected to said output terminal and said second power source terminal, respectively;
   f. a fifth transistor having a base, an emitter, and a collector electrode, said fifth transistor collector electrode being connected to the base electrodes of said second and fourth transistors, and said fifth transistor emitter and base electrodes being connected to said second power source terminal and said input terminal, respectively;
   g. a constant current source connected to said fifth transistor collector electrode;
   h. means for coupling said fourth transistor emitter electrode to said output terminal;
   i. a first resistor and first diode connected in series with each other, with said series connected in parallel and in the same direction of conduction as the emitter-base path of said first transistor; and
   j. a second resistor and second diode connected in series with each other, with said series connected in parallel and in the same direction of conduction as the base-emitter path of said third transistor.

* * * * *